United States Patent
Xia et al.

(10) Patent No.: US 8,127,187 B2
(45) Date of Patent: Feb. 28, 2012

(54) METHOD AND APPARATUS OF ATE IC SCAN TEST USING FPGA-BASED SYSTEM

(75) Inventors: Yu Xia, Campbell, CA (US); Dale Ventura, San Jose, CA (US); Ashok Ramachandran, Sunnyvale, CA (US)

(73) Assignee: Integrated Device Technology, Inc., San Jose, CA (US)

( * ) Notice: Subject to any disclaimer, the term of this patent is extended or adjusted under 35 U.S.C. 154(b) by 65 days.

(21) Appl. No.: 12/571,344

(22) Filed: Sep. 30, 2009

(65) Prior Publication Data

US 2011/0078525 A1 Mar. 31, 2011

(51) Int. Cl.
*G01R 31/28* (2006.01)
(52) U.S. Cl. ........ 714/726; 714/727; 714/731; 714/728; 714/741
(58) Field of Classification Search .................. None
See application file for complete search history.

(56) References Cited

U.S. PATENT DOCUMENTS

| | | | |
|---|---|---|---|
| 6,594,802 B1 * | 7/2003 | Ricchetti et al. | 716/136 |
| 6,654,919 B1 * | 11/2003 | Watkins | 714/733 |
| 7,080,300 B1 * | 7/2006 | Herron et al. | 714/726 |
| 7,191,372 B1 * | 3/2007 | Jacobson et al. | 714/724 |
| 7,269,724 B1 * | 9/2007 | Trimberger et al. | 713/100 |
| 7,305,598 B1 * | 12/2007 | Sanghani et al. | 714/724 |
| 7,480,843 B1 * | 1/2009 | Jacobson | 714/725 |
| 7,661,048 B2 * | 2/2010 | Gomez et al. | 714/727 |
| 2003/0196151 A1 * | 10/2003 | Evans | 714/724 |
| 2006/0273809 A1 * | 12/2006 | Miller et al. | 324/754 |

OTHER PUBLICATIONS

Rogel-Favila, B.; Automatic test generation and fault diagnosis of boundary scan circuits, Apr. 8, 1992, IEEE, 3/1-3/4.*

* cited by examiner

*Primary Examiner* — Cynthia Britt
*Assistant Examiner* — Guerrier Merant
(74) *Attorney, Agent, or Firm* — Haynes and Boone LLP

(57) ABSTRACT

An apparatus and a method for enhancing the use of automated test equipment (ATE), are presented. The apparatus comprises a test load board that mounts a plurality of devices to be tested (DUTs), and a daughter card communicating with the test board and the ATE, testing each of the plurality of devices, and providing test results to the ATE. The method comprises mounting a plurality of devices to be tested on the test load board, using the daughter card to communicate with the test board and the ATE, and using the daughter card for testing each of the plurality of DUTs, providing test results to the ATE. Also provided is a system to perform automated tests of integrated chips, comprising an ATE scan test unit, an off-load tester resource coupled to the ATE scan test unit, a processor executing commands to control the ATE unit and the off-load tester resource.

23 Claims, 14 Drawing Sheets

METHOD AND APPARATUS OF ATE IC SCAN TEST USING FPGA-BASED SYSTEM

BACKGROUND

1. Field of the Invention

The embodiments described herein relate generally to the field of automated test equipment (ATE) and, more particularly, to test equipment that performs integrated circuit (IC) scan tests.

2. Description of Related Art

In current applications for the integrated circuit (IC) industry, with the demand for higher throughput of devices, state-of-the-art automated test equipment ATE presents a resource limitation problem. Two particular resources of relevance are scan vector memory and scan channels. The insufficiency of these resources at the ATE system level is translated into a production test throughput limitation due to the inability of state-of-the-art ATEs to test multiple devices on a single device under test (DUT) board.

Traditionally in the semiconductor IC industry, to achieve scan test results that keep up with production demands, the solution is to increase ATE resources, such as acquiring more scan vector memory and adding more scan channels on the ATE, or simply to replace the existing ATE structure with one that has more resource capabilities for the implementation of the scan test. This approach unduly increases the overall cost of the test system and drives up the cost of production.

In general, scan tests performed by existing ATE systems take place at a slow speed, normally with a 10 MHz-100 MHz clock rate. The loose timing requirements imposed by these systems have an adverse effect on the overall speed of the testing protocol, and even on the accuracy of the results.

What is needed is a method and an apparatus to increase the resource capabilities of existing ATE systems, without the need to expand/upgrade ATE resources. Also, there is a need for a faster measurement protocol to be implemented externally to the ATE, with better timing control and more precise clocking mechanisms. The ultimate result will be to reduce investment costs on ATE hardware for the industry, with the consequent reduction in overall product cost.

SUMMARY

An apparatus and a method for enhancing an automated test equipment (ATE), are presented. The apparatus comprises a test load board that mounts a plurality of devices to be tested (DUTs), and a daughter card communicating with the test board and the ATE, testing each of the plurality of devices, and providing test results to the ATE. The method comprises mounting a plurality of devices to be tested on the test load board, using the daughter card to communicate with the test board and the ATE, and using the daughter card for testing each one of the plurality of DUTs, providing test results to the ATE. Also provided is a system to perform automated tests of integrated chips, comprising an ATE scan test unit, an off-load tester resource coupled to the ATE scan test unit, a processor executing commands to control the ATE unit and the off-load tester resource.

These and other embodiments of the present invention are further described below with reference to the following figures.

In the figures, elements having the same designation have the same or similar function.

DETAILED DESCRIPTION

Scan test is the most popular design for test (DFT) methodology and is often implemented in register transfer level (RTL) design. Stuck-at-fault, DSM (at-speed) are common scan technologies for capturing manufacturing defects in IC chips. Normally, a scan vector is generated by an automated test pattern generator (ATPG) tool with a standard file format (e.g. WGL, STIL). Depending on device function, feature design and test coverage, the scan vector size can vary. More logic gate implementation and higher error coverage will naturally increase the scan vector size, imposing a higher demand on the memory resources of the ATE system. For scan test program development, scan test vectors are converted into ATE format with timing and level setup. The tester will load scan vectors into vector memory for testing. Therefore, the scan vectors memory size is one key factor for ATE program.

The Verigy (Agilent sold tester to Verigy) 83000/93000 ATE system is one test platform commonly used to test IC chips in manufacturing. Most of the testers have 16 scan channels, and utilize a scan memory size from a 64 Mb/ch (Mega-bites per channel) to 256 Mb/ch, and normal vector memory from 4 Mb/ch to 8 Mb/ch. This memory size results in limitations for scan test implementation. For example, the total number of scan channels of one device under test can be no more than 8 scan chains, a scan chain being one input/output pair of channels. Furthermore, the scan vector size is then less than 256 Mb per scan chain. Moreover, if the device under test has more than 4 scan chains, only one device can be tested at a time. The number of scan channels and scan vector memory sizes are two factors limiting multi-site testing, and often times become the bottleneck of production testing throughput.

Some embodiments of the present invention provide a plug-in card that attaches to custom-built, multi-site test load board fixtures and works in sequence with the existing ATE system to perform scan tests. Some embodiments of the present invention include an apparatus for use with an ATE IC scan test, using a field programmable gate array (FPGA)-based system, further including a daughter card, which may include a FPGA structure. The apparatus can be further provided with a control unit and peripheral components.

Some embodiments of the present invention include a method for operating automated test equipment (ATE) of integrated circuits (IC) scan test, using a field programmable gate array (FPGA)-based system, wherein the method includes providing design simulation files in a specified format and using programmable converter scripts to modify the design simulation files from a specified format into a flash memory format. Further, programmable graphic user interface commands for providing ASCII vectors in binary format to on-board flash memories can be used.

Figure 1:
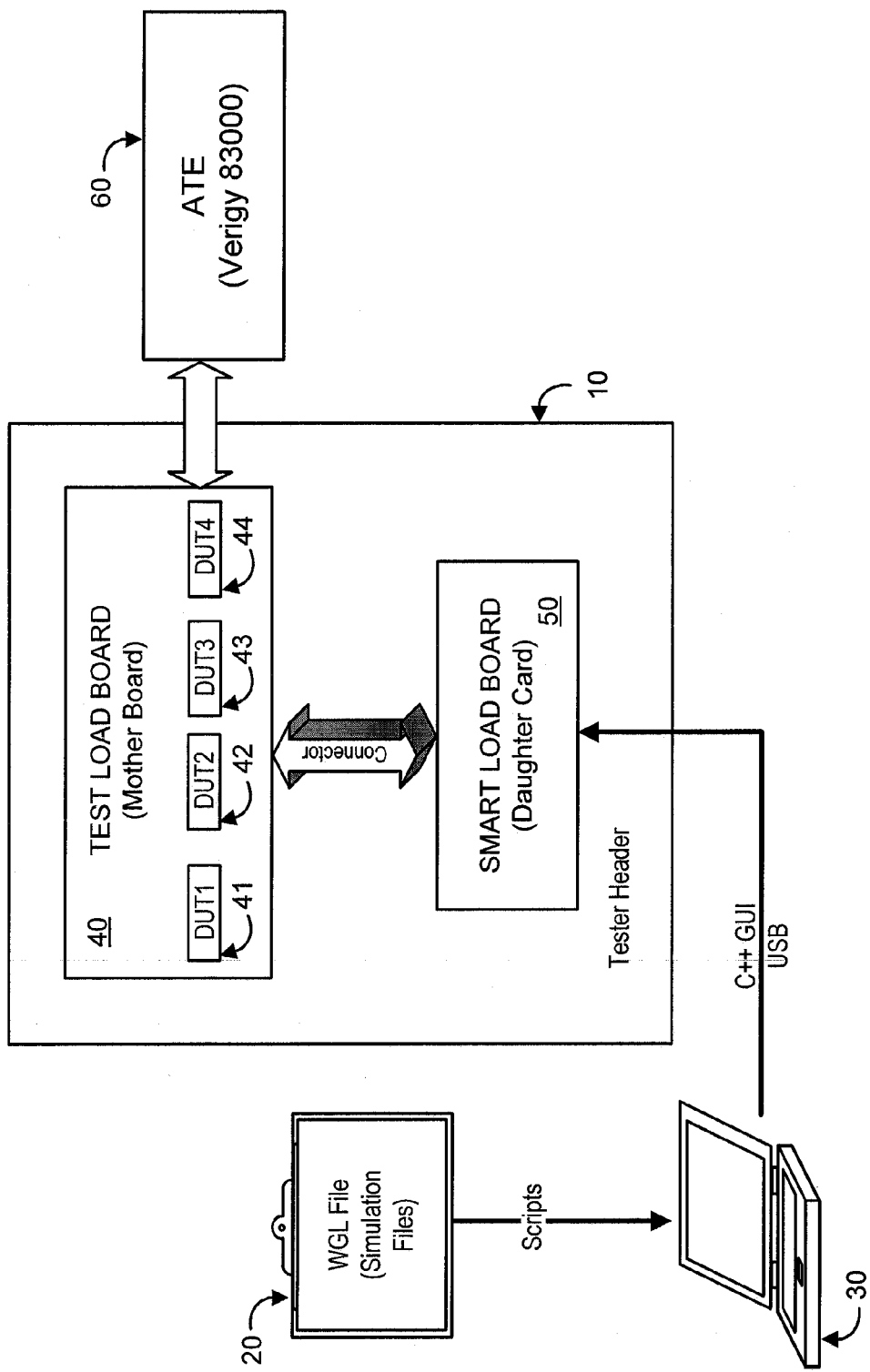
FIG. 1 shows a high level schematic view of some embodiments of the present invention.

FIG. 1 illustrates an off-load tester resource 10 according to some embodiments of the present invention. Off-load tester resource 10 is coupled to ATE tester 60. ATE tester 60 can be any tester system, including the Verigy 83000. Off-load tester 10 includes a "Smart" load board 50, hereinafter referred to as a "daughter" card 50, and a test load board 40, hereinafter referred to as "mother" board 40. DUTs are loaded into mother board 40 for testing. Although any number of DUTs can be loaded, FIG. 1 shows four devices implemented for testing: DUT1 41, DUT2 42, DUT3 43, and DUT4 44.

The communication between off-load tester 10 and ATE tester 60 can include a hand-shake protocol wherein ATE tester 60 sends a signal to off-load tester 10 to start a test, and off-load tester 10 returns a signal to the ATE tester 60 to establish that a test has been completed and provide the result of the test, on a pass/fail basis for example.

In some embodiments of the present disclosure, ATE tester 60 may be configured to recognize and communicate with ancillary equipment useful in the fabrication environment where ATE tester 60 is utilized. This ancillary equipment may include, for example, a chip handler to automatically carry the DUTs in and out of ATE tester 60 and off-load tester 10. Other ancillary equipment may include a real-time oscilloscope to perform signal analysis and debugging of failed DUTs, according to test results.

In general, the scan from ATE 60 tests at "slow speed" (10 Mhz-100 Mhz clock rate) with "loose" timing (setup/hold/access) requirements. Off-load tester 10, which is external to ATE 60, can relieve ATE 60 from overloading. ATE tester 60 can provide power supplies, setup device signals, and can monitor test results. Off-load tester resource 10 interacts with DUTs 41-44 to implement testing, greatly expanding the resource capabilities of ATE 60.

In the embodiment depicted in FIG. 1, DUTs 41-44 are being tested. In some embodiments, for example, ATE 60 provides a 3.3V and a 1.2V supply for each of DUTs 41-44. ATE tester 60 typically uses a JTAG (Joint Test Action Group) protocol to setup a scan mode for the test. In the case of an at-speed scan test, ATE tester 60 also provides a system reference clock, for example a 156.25 MHz clock, to DUTs 41-44 installed in off-load tester 10.

Also shown in FIG. 1, off-load tester 10 is coupled to a processor 30, which may be any processor system, including a computer system. A WGL file 20 that includes the scan test vectors to be utilized in the test protocol is generated by an automated test pattern generator (ATPG) tool and can be stored on or generated by processor 30. WGL file 20 includes simulation protocols that can be formatted into ASCII characters. WGL file 20 may be formatted in a standard simulation template, which is generated by a commercially available software tool that utilizes the building blocks in the IC, as provided by the designer. In some embodiments of the present invention, the scan-test vectors in WGL file 20 are formatted in ASCII characters, and may need to be formatted into binary characters by an application executed on processor 30.

The scan-test vectors thus formatted may be stored in a flash memory within daughter card 50. In some embodiments of the present disclosure, the reformatted scan vectors are provided, each, one bit, "1" or "0", to drive scan-in signals, and two bits to indicate scan-out data, "H", "L", or "X" (01,00,1x, respectively).

Figure 5:
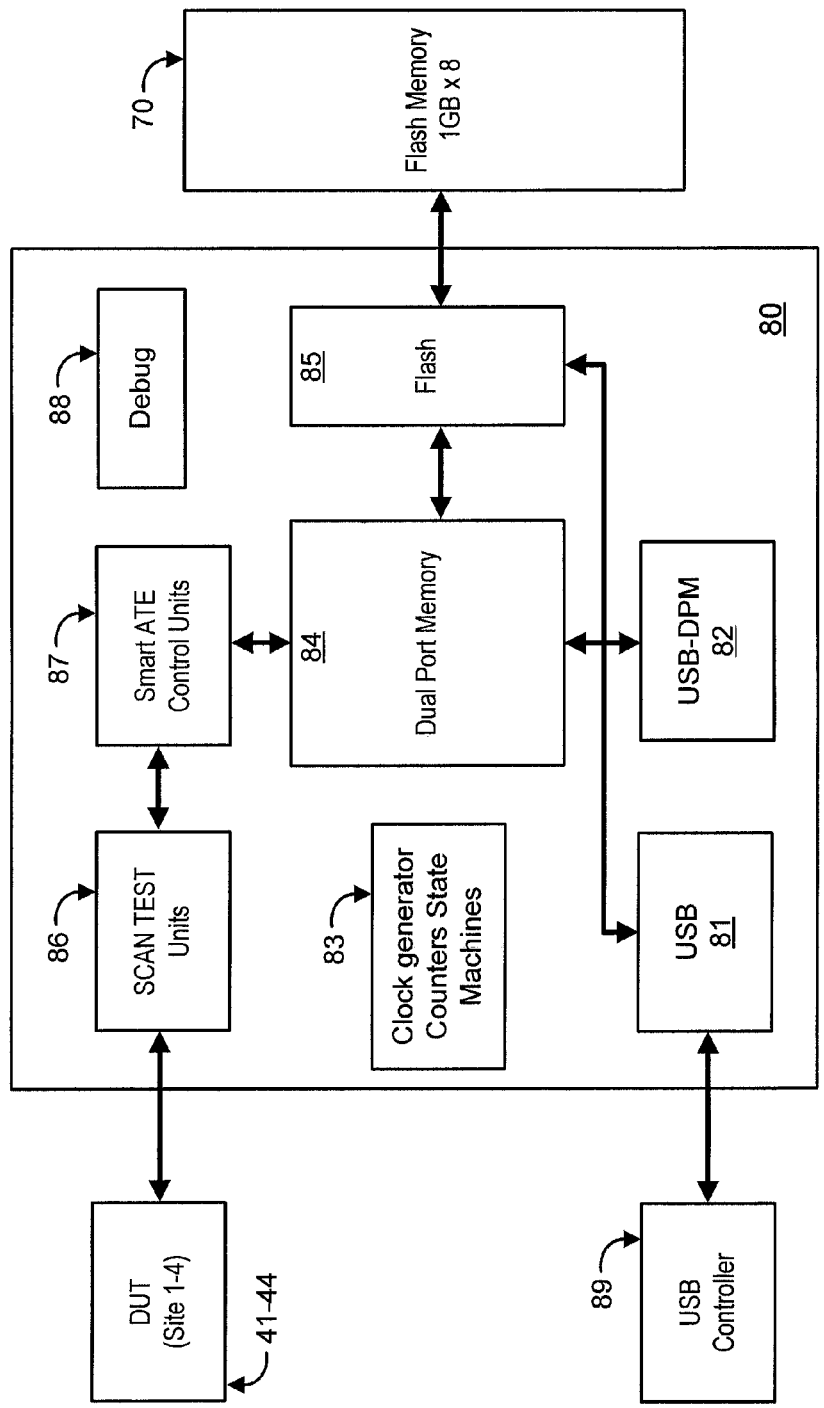
FIG. 5 shows a block diagram of a field-programmable gate array (FPGA) circuit, its internal and its peripheral connections, according to some embodiments of the present invention.

The daughter card 50 includes a field-programmable gate array circuit (FPGA, to be described in detail in FIG. 5). The FPGA circuit has two main functions. First, the FPGA programs flash memories with scan vectors. Second, the FPGA controls the scan test to the DUT through a function block.

Figure 2:
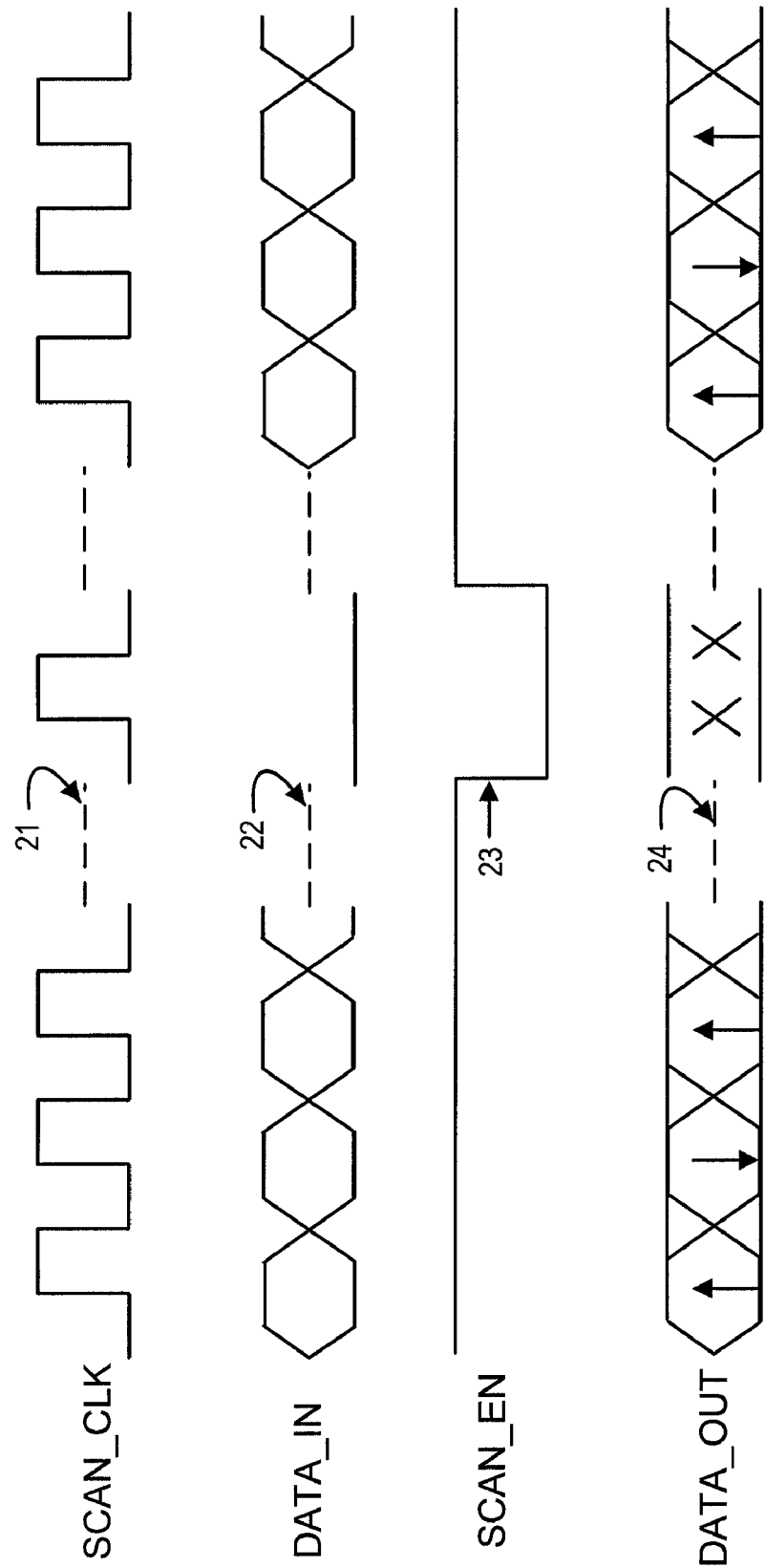
FIG. 2 shows a schematic depiction of scan signals employed in some embodiments of the present invention.

FIG. 2 shows a schematic representation of the signals that are handled by the function block of the FPGA in daughter card 50, according to some embodiments of the present invention. These signals comprise a scan clock 21, scan data to the DUT 22, and scan enable signal 23. The function block of the FPGA also simultaneously receives data output 24 from the DUT. Referring to FIG. 2, an 'Up' arrow in data output signal 24 means comparing a high voltage level "H", 'Down' arrow means comparing a low voltage level "L", and X means "do not care" about the voltage level "X". The FPGA then compares data output 24 with expectation vectors stored in the flash memory and provides a pass/fail result based upon whether or not all bits in a scan-test output vector match a reference scan-test vector. Scan clock signal 21 provides a synchronization tool so that the proper bits are compared between the scan-test output vector provided by the DUT and the reference scan-test vector, thereby avoiding spurious fail test results produced by a mismatch or misalignment (in time) of scan-test output and scan-test reference vectors. A time-mismatch or misalignment between the signals may be expected due to internal delays naturally occurring within the interconnection lines in FPGA card and in daughter card 50.

Figure 3:
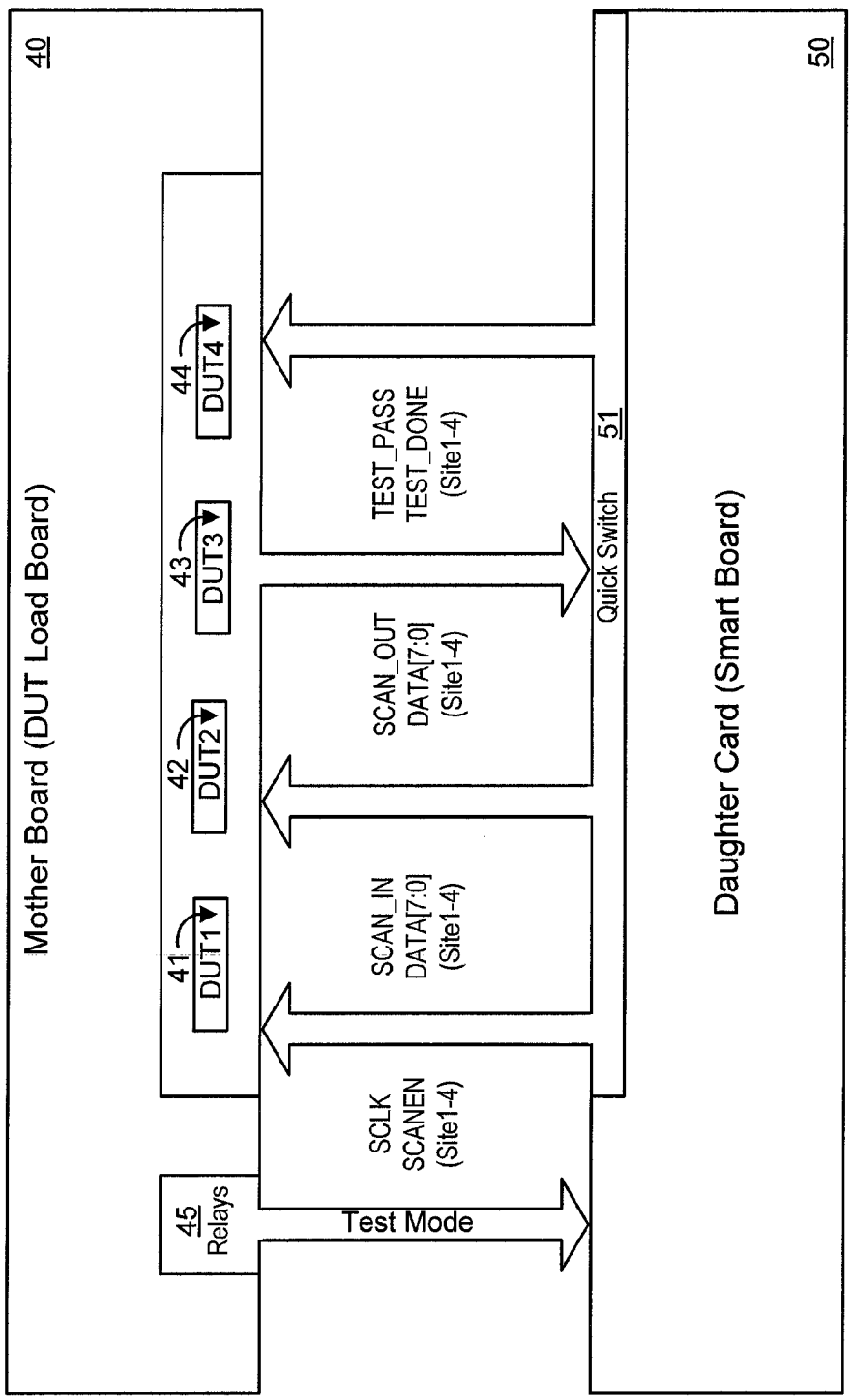
FIG. 3 shows a schematic of the interconnection between the mother board and the daughter card according to some embodiments of the present invention.

FIG. 3 shows a schematic representation of the data flow inside off-load tester 10

(FIG. 1) between mother board 40 and daughter card 50 according to some embodiments of the present invention. Mother board 40 contains DUTs 41-44, whereas the signal traffic between the daughter card and the DUTs is controlled by quick switch 51, inside the daughter card. Relays 45 provide signals to "test start" pins in daughter card 50 in order to activate different test modes. Further details of relay circuits 45 used in some embodiments of the present invention are provided below with reference to FIG. 8.

Figure 4:
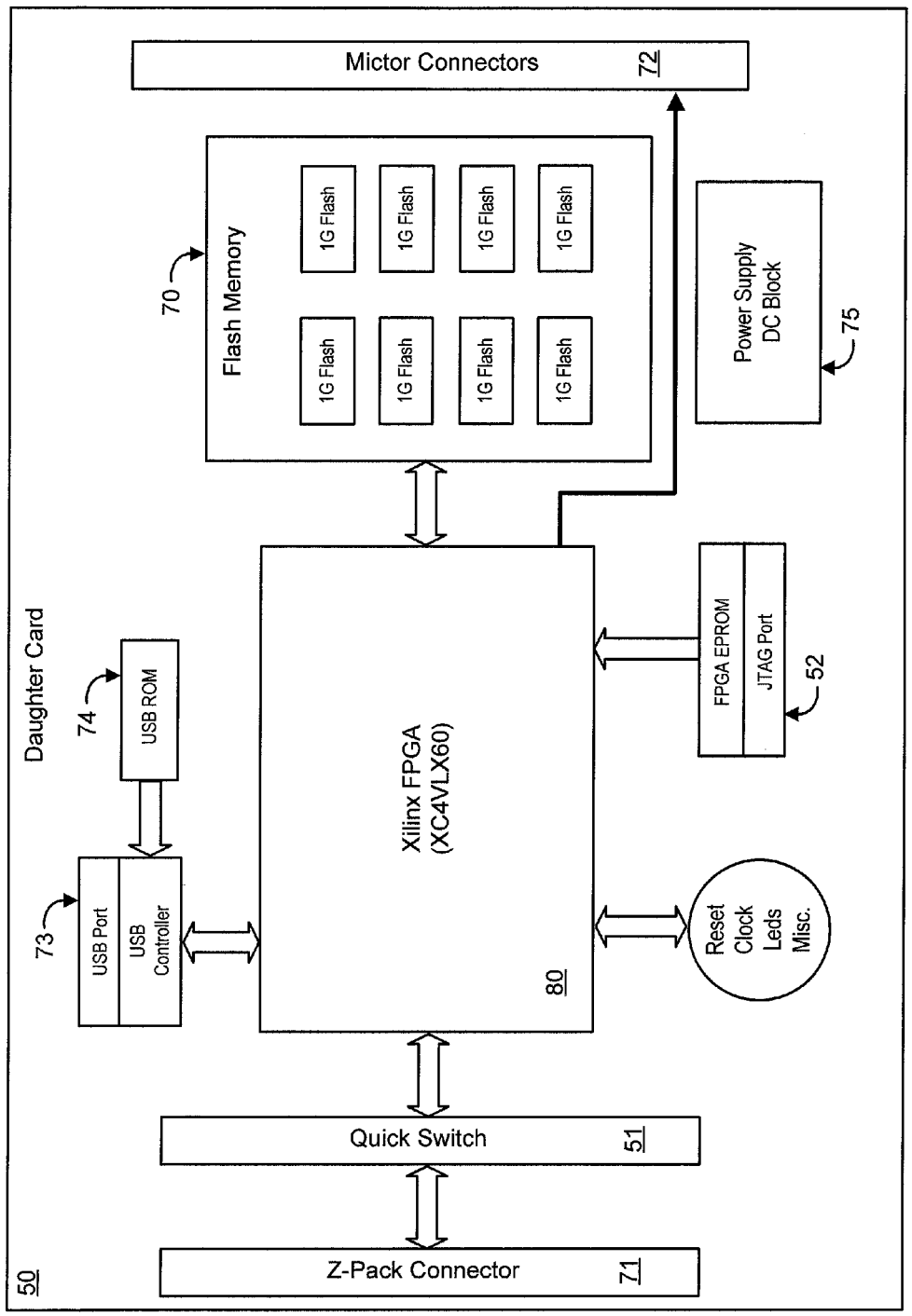
FIG. 4 shows a block diagram of a daughter card, including a field-programmable gate array (FPGA), according to some embodiments of the present invention.

FIG. 4 is a block diagram showing the inner architecture of an exemplary daughter card 50, according to some embodiments of the present invention. As shown in FIG. 4, daughter card 50 has its own power supply 75. When first powered-on, on-board EPROM 52 (erasable programmable read-onlymemory) of FPGA 80 in daughter card 50 loads the scan vectors into FPGA 80. Then, during DUT testing, daughter card 50 does not power off. All the signals from each of DUTs 41-44 to daughter card 50 pass through quick switch 51, adapted to Z-pack connector 71 for accessibility. In some embodiments of the present invention, quick switch 51 corresponds to circuit model No. IDTQS34. Quick switch 51 can turn on/off data bus links to the power supply in mother board 40. After the test is finished, the data bus between DUTs 41-44 and daughter card 50 may be 'tri-stated' (connector pins are disconnected and no current flows through the connector) until the next one of DUTs 41-44 is ready for testing. Also shown in FIG. 4 is the block representing flash memory 70. In the embodiment depicted in FIG. 4, flash memory 70 includes 8 memory units of 1 GByte capacity each ($10^9$ bits), although in general flash memory 70 may include any number of memory units of any size. This large memory size allows FPGA circuit 80 to handle large scan vector files, and more scan channels. In some embodiments, 40 or 80 test channels may be used with flash memory 70 as depicted in FIG. 4. In some embodiments, the availability of a large flash memory 70 will allow the use of daughter card 50 for other applications and other products, at the same time as providing extended resources for the ATE scan test system. Also illustrated in FIG. 4 are Mictor Connectors 72 (Mictor stands for "Match Impedance Connector"), which provide the ability to display internal signals in FPGA 80 for debugging purposes. FPGA 80 programs flash memory 70 through USB port 73, which links FPGA 80 to a PC. USB ROM 74 initializes USB controller 89 (cf. FIG. 5 below) so that block USB 81 in FPGA 80 (cf. FIG. 5 below) can transfer data (e.g. scan test vectors) from the PC to flash memory 70.

FIG. 5 shows a block diagram of the detailed structure inside the FPGA circuit 80, according to some embodiments of the present disclosure. Peripherals such as a flash memory 70 (also illustrated in FIG. 4), a USB controller 89, and DUTs 41-44 in mother board 40, are also shown, to more clearly illustrate the data flow. USB controller 89 governs the link between FPGA card 80 and an external programming processor unit. This external programming processor unit may be part of a computer or any other hardware device running an application that enables the programming of FPGA card 80. In some embodiments of the present disclosure, scan-test vectors may also be loaded into Flash memory 70 through USB controller 89, using an external processor unit running an application that enables the loading of data into Flash memory 70.

Also shown in FIG. 5 is clock generator/Counters/State machines unit 83. The clock generator/counters/state machines unit 83 generates the system clock, a scan input clock and a scan output clock for sampling and capturing scan data flow, as well as providing a logic system clock for FPGA card 80. The clock generator unit 83 also creates internal counters to address scan vector locations in flash memory 70. The clock generator/Counters/State machines unit 83 monitors the internal logic states of FPGA 80. Depending on different conditions, clock generator/Counters/State machines unit 83 will launch 'accounting' function features such as statistics of bytes processed and pass/fail results. Dual port memory (DPM) 84 is a built-in dual port memory block for FPGA card 80. Dual port memory 84 works along with USB/DPM 82 as an internal data buffer to communicate with different clock domains between USB 81, flash 85 and dual port memory 84. During the programming of flash memory 70, flash 85 will communicate with USB 81 to fetch scan vectors from USB controller 89, and transfer and store vector data into flash memory 70. During a scan test operation, flash 85 will fetch scan input and output data from flash memory 70 and transfer it to dual port memory 84, which creates scan input data for DUTs 41-44 and compares scan output data from DUTs 41-44.

Continuing to refer to FIG. 5, scan test units 86 set up a scan data timing schedule to provide scan data input to send to DUTs 41-44, as well as capture scan data output from DUTs 41-44 to send to Smart ATE Control Units 87, for comparing results. Smart ATE Control units 87 control the data flow between DPM 84 and scan test units 86, providing scan input data and comparing scan output data, as well as producing test results (Pass/Fail) and test conditions (test done) for each one of DUTs 41-44. Debug block 88 has the capability to monitor internal signals, and link with an external test point (Mictor Connectors 72 in FIG. 4), which can observe and display internal signals status for debugging purposes.

Figure 6:
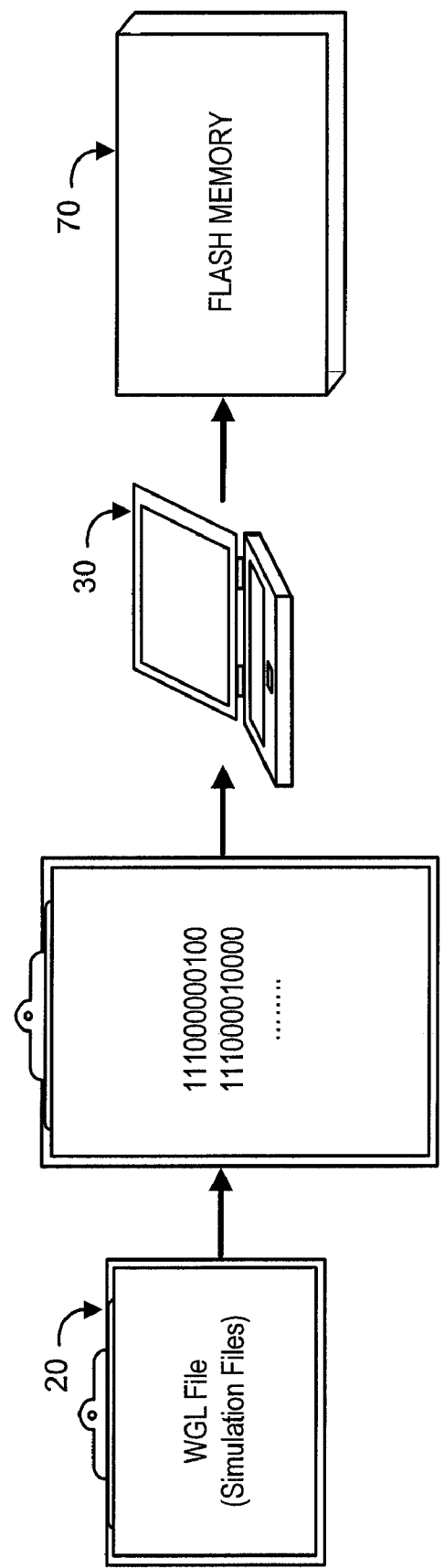
FIG. 6 shows a schematic representation of a simulation file converted into flash memory format using a GUI interface and an FPGA according to some embodiments of the present invention.

FIG. 6 shows a schematic representation of the conversion of a simulation WGL file 20, from an ASCII coded file into a binary format, following a one-to-one correspondence, by using a GUI-based application 30 according to some embodiments of the present invention. The binary coded file is then compiled and stored in flash memory 70 of daughter board 50 by using FPGA circuit 80. In some embodiments of the present invention, flash memory 70 can be programmed separately from the function design of the FPGA circuit 80, thus shortening design cycles and reducing the daughter card size.

Figure 7:
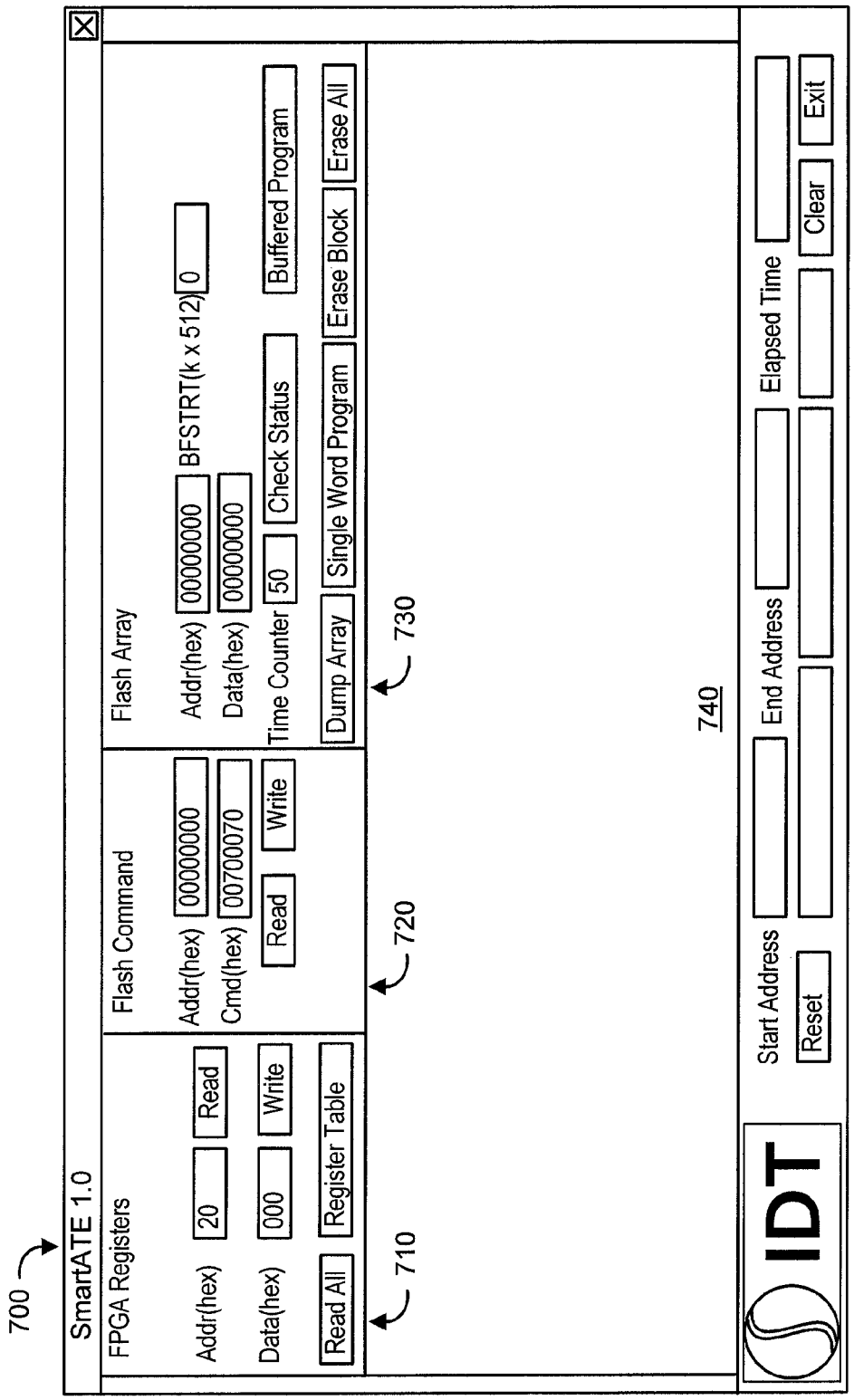
FIG. 7 shows a GUI interface to write into a specific location of the flash memory, according to some embodiments of the present invention.

FIG. 7 shows an embodiment of GUI-based program 700 used to convert simulation files from ASCII format into binary format readable by flash memory 70. GUI program 700 can convert ASCII WGL file 20 shown in FIG. 6 into binary format, and includes functions 710, 720, and 730 to transfer the binary data into flash memory 70 (cf. FIG. 6). GUI function 730 can set single word write or block write modes, also defining the start address location in flash memory 70 to transfer data. GUI function 730 also provides the ability to erase the contents and check status in flash memory 70. GUI program 700 also provides monitor status window 740 to control and monitor the data transfer process. For debug purposes, GUI program 700 provides function 710, which can send commands to or receive the register status from Flash 85 of FPGA 80 (cf. FIG. 5). GUI program 700 also provides function 720 to directly write or read any memory location in flash memory 70 (cf. FIG. 5).

Figure 8:
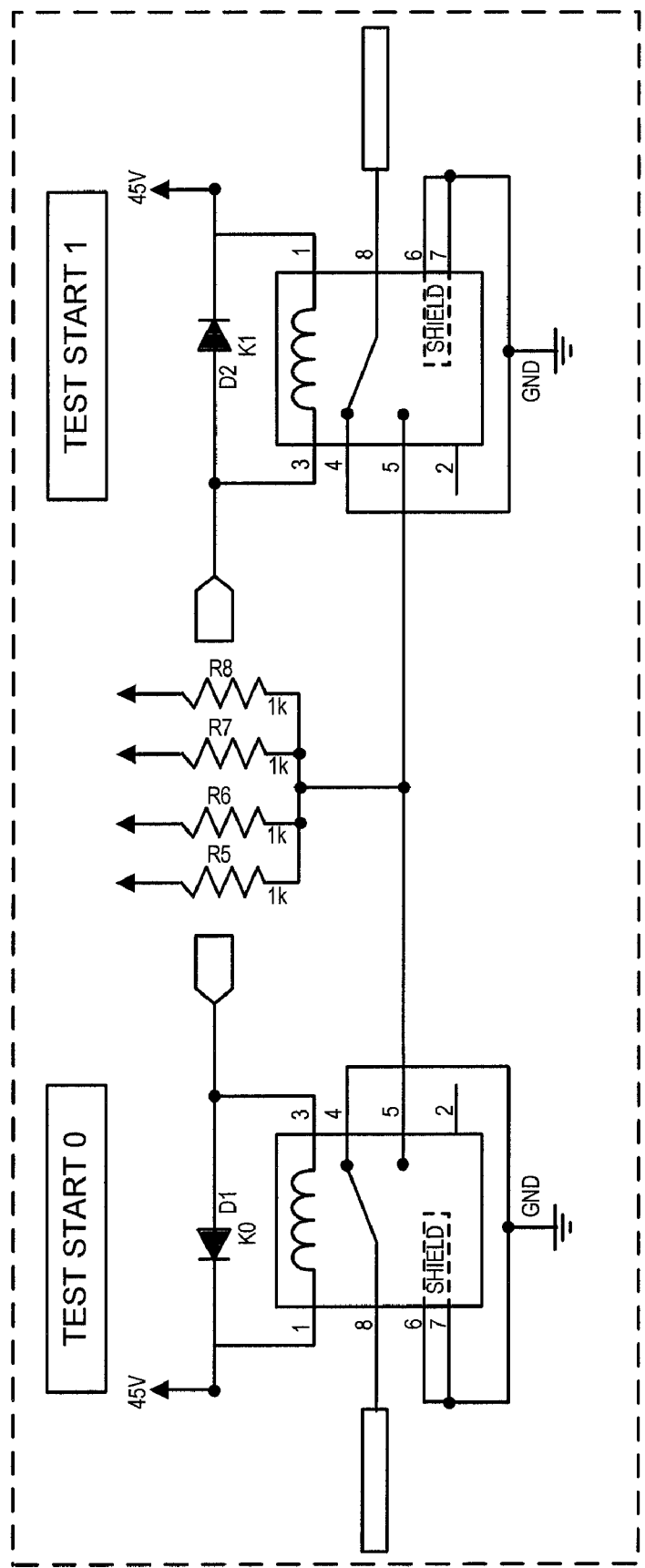
FIG. 8 shows two relay circuits built on the load board to control two test start pins that activate different test modes, according to some embodiments of the present invention.

FIG. 8 shows an embodiment of relay circuit 45 used in mother board 40 of FIG. 3. In some embodiments of the present invention, as illustrated in FIG. 8, two relays are used to control two test start pins, providing four different test modes as per the digital combinations 00, 01, 10, and 11. The test modes in the embodiment shown in FIGS. 3 and 8 correspond to "scan enable, data in, data out, test done."

Figure 9:
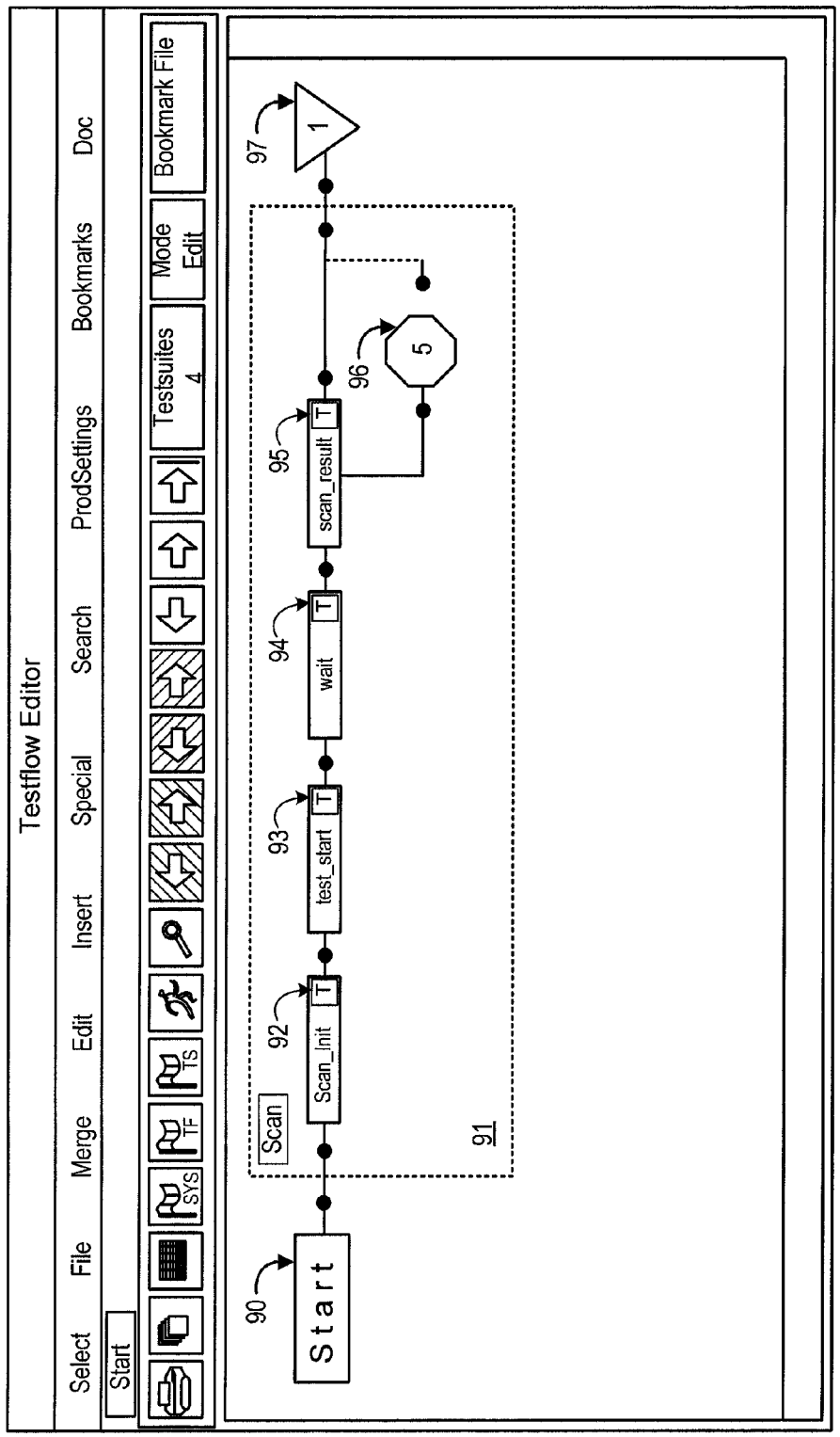
FIG. 9 shows an ATE test program setup being used to control the entire test system according to some embodiments of the present invention.

FIG. 9 shows a template for the programming of a scan test in an ATE tester 60 interface (Verigy 83000), according to some embodiments of the present invention. The program includes Start command 90, which initiates the scan test sequence suites 91. Scan sequence 91 includes a scan initialization stage 92. Once the scan start stage 93 is started, a wait stage 94 follows, while ATE unit 60 waits to receive the scan results, which are received in stage 95. A fail state of the DUTs 41-44 would lead to a fail stop stage 96. A pass state of the DUTs 41-44 leads to a pass stop stage 97. Once all DUTs have completed the test, ATE tester unit 60 goes back to start stage 90.

Figure 10:
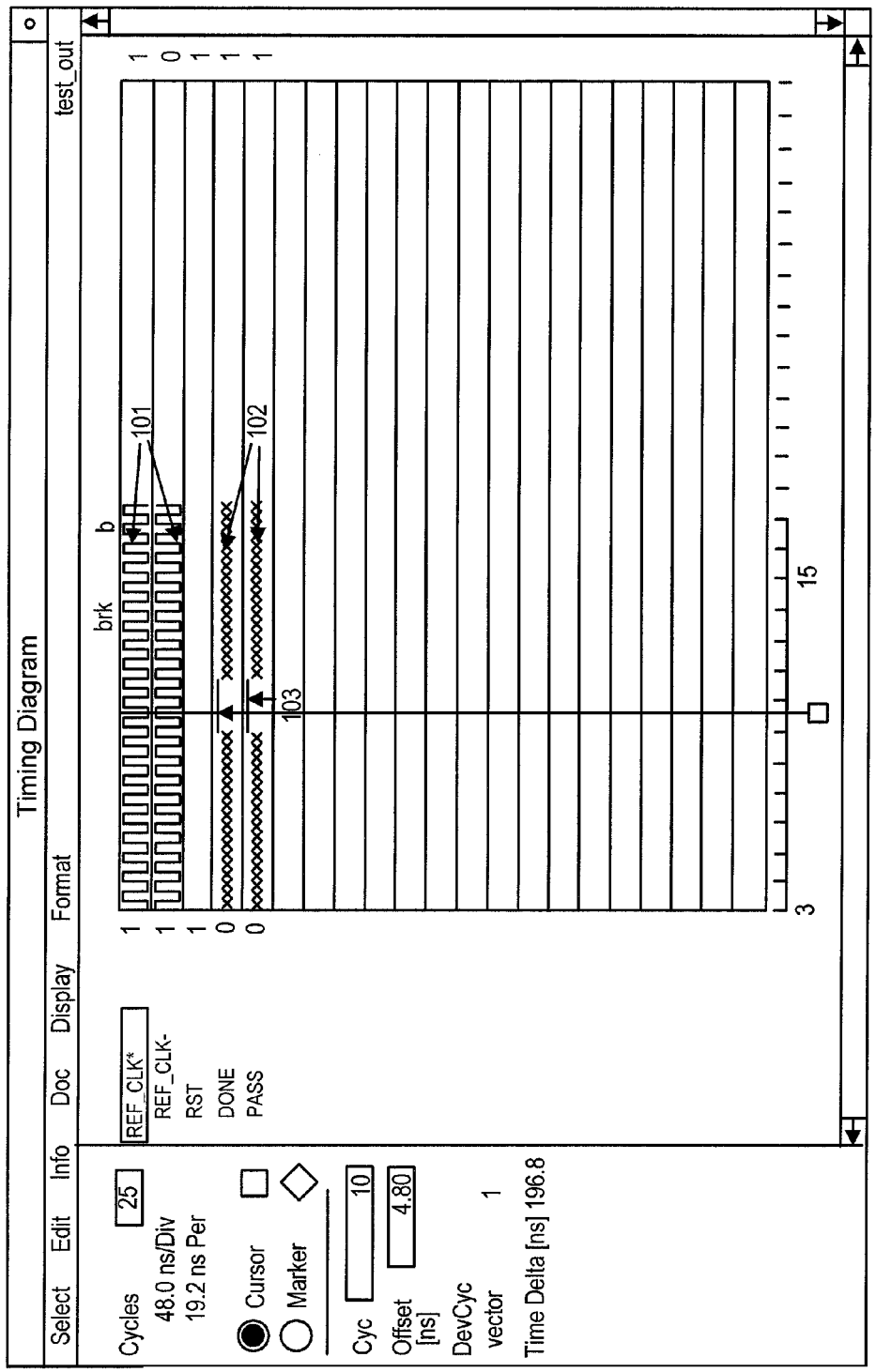
FIG. 10 shows the setup of a reference clock signal in an ATE test program setup according to some embodiments of the present invention.

FIG. 10 shows an exemplary waveform used by ATE tester 60 in scan test stage 95 (cf. FIG. 9), according to some embodiments of the present invention. ATE tester 60 provides reference clocks 101 to FPGA 80 to capture test results. Signals 102, labeled 'PASS' and 'DONE', are test results provided by smart ATE control units 87 (cf. FIG. 5), which provide test results of DUTs 41-44. A logic "H" state 103 within signals 102 indicate DUT scan test is passed and completed ('PASS' and 'DONE').

Figure 11:
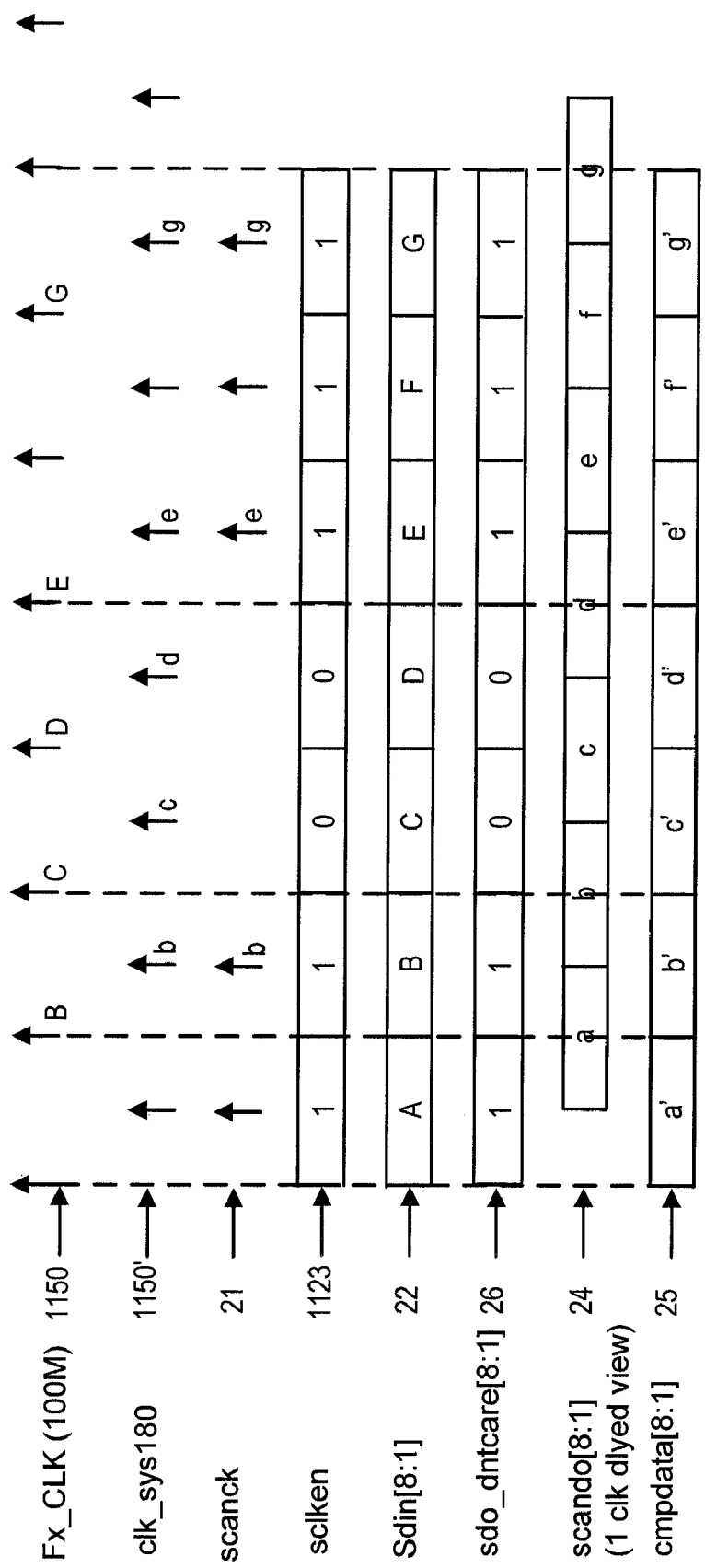
FIG. 11 shows a schematic of the operation of a scan clock generator in an FPGA circuit according to some embodiments of the present invention.

FIG. 11 shows a schematic diagram of scan clock generator 83 shown in FIG. 5, according to some embodiments of the present invention. System clock 1150 is generated, where arrows pointing 'up' represent the clock pulses. Together with system clock 1150, a 180° phase shifted system clock is generated 1150' in order to attain a better timing precision and synchronize scan output data from DUTs 41-44 with compare data fetching from flash memory 70. Scan clock signal 21 is the result of multiplying shifted system clock 1150' with "do/do not care" string 26. Scan clock enable signal 1123 is the compare control bit of scan vector in flash memory 70. Input data 22 is synchronized with clock signal 21, where the letters A, B, C, D, E, F, G represent a sequence of bits in the input data string, which are sent to DUTs 41-44 as scan input data. Output data 24, which is captured from DUTs 41-44, may have a certain delay, relative to scan clock 21. Compare data 25 is synchronized to scan clock 21, and is a preset compare scan out data stored in flash memory 70. Any re-adjustment necessary to synchronize output data 24 and compare data 25 may be obtained thereafter within FPGA 80.

Figure 12:
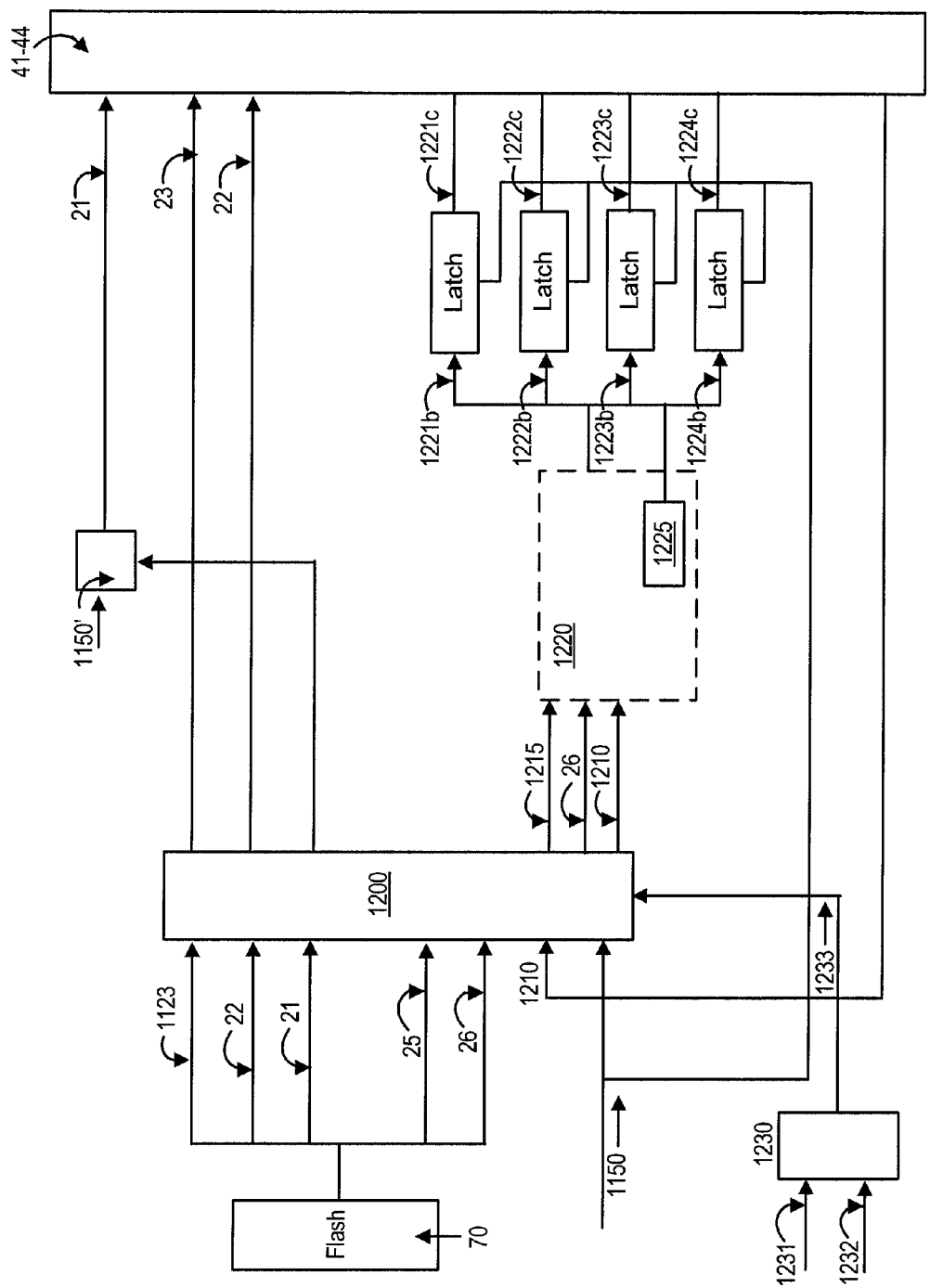
FIG. 12 shows a flow diagram of a scan test data flow in an FPGA circuit according to some embodiments of the present invention.

FIG. 12 shows the data flow diagram according to some embodiments of scan test unit 86 in FIG. 5. Block 1230 generates an input enable signal 1233 to hold the scan clock until the first data is read from flash memory 70, according to input bits "flash read add count enable" 1231, and "end of scan data" 1232. In some embodiments of the present disclosure, the scan output data 1210, generated from DUTs 41-44 is captured by scan output clock and latch into register 1200, once input enable signal 1233 is activated. Data in register 1200 will compare output data 1210 with compare data 25 from flash memory 70, along with 'do not' care signal 26. System clock 1150 and system clock shifted by 180° 1150' are provided in order to synchronize the scan clock to the system clock for each of the DUTs.

Flash memory 70 provides the scan-test data to FPGA 80, namely scan clock enable signal 1123, scan clock signal 21, scan enable signal 23, input data 22 (which provides scan input data to DUTs 41-44) and also provides scan compare data string 25, which is the data string that will be compared to output scan vectors 1210, from DUTs 41-44, in the test procedure. Flash memory 70 also provides a "do/do not care" string 26—corresponding to each bit in data string 25. In some embodiments of the present disclosure, the data string provided by Flash memory 70 includes a 32 bit string, which is separated in eight bit strings for each of input data string 22, scan compare string 25, and "do/do not care" string 26, and a one bit string for each of scan clock enable signal 21 and scan enable signal 23.

Continuing to refer to FIG. 12, "do not care" string 26 controls eventually whether or not a comparison operation is performed in compare logic 1220 for each bit in output scan vector 1210 and compare data 25. A second register (not shown in FIG. 12) receives compare data string 25 after it passes through first register 1200 and provides a scan compare data string 1215 to compare logic 1220.

Compare logic block 1220 performs logical operations comparing the output scan vectors 1210 from DUTs 41-44 with compare data string 1215. Logic block 1220 also generates a "DUT OK" output 1221b-1224b to latch circuits (labeled accordingly in FIG. 12) which hold the state bit to a "pass/fail" state while waiting for a scan test to start, according to scan test enable bit 1225 and system clock 1150. Once latch circuits 1221c-1224c are released, output signals transmit the test result as a "DUT pass" bit 1221c-1224c which may be 1 for "pass" and 0 for "fail."

Figure 13:
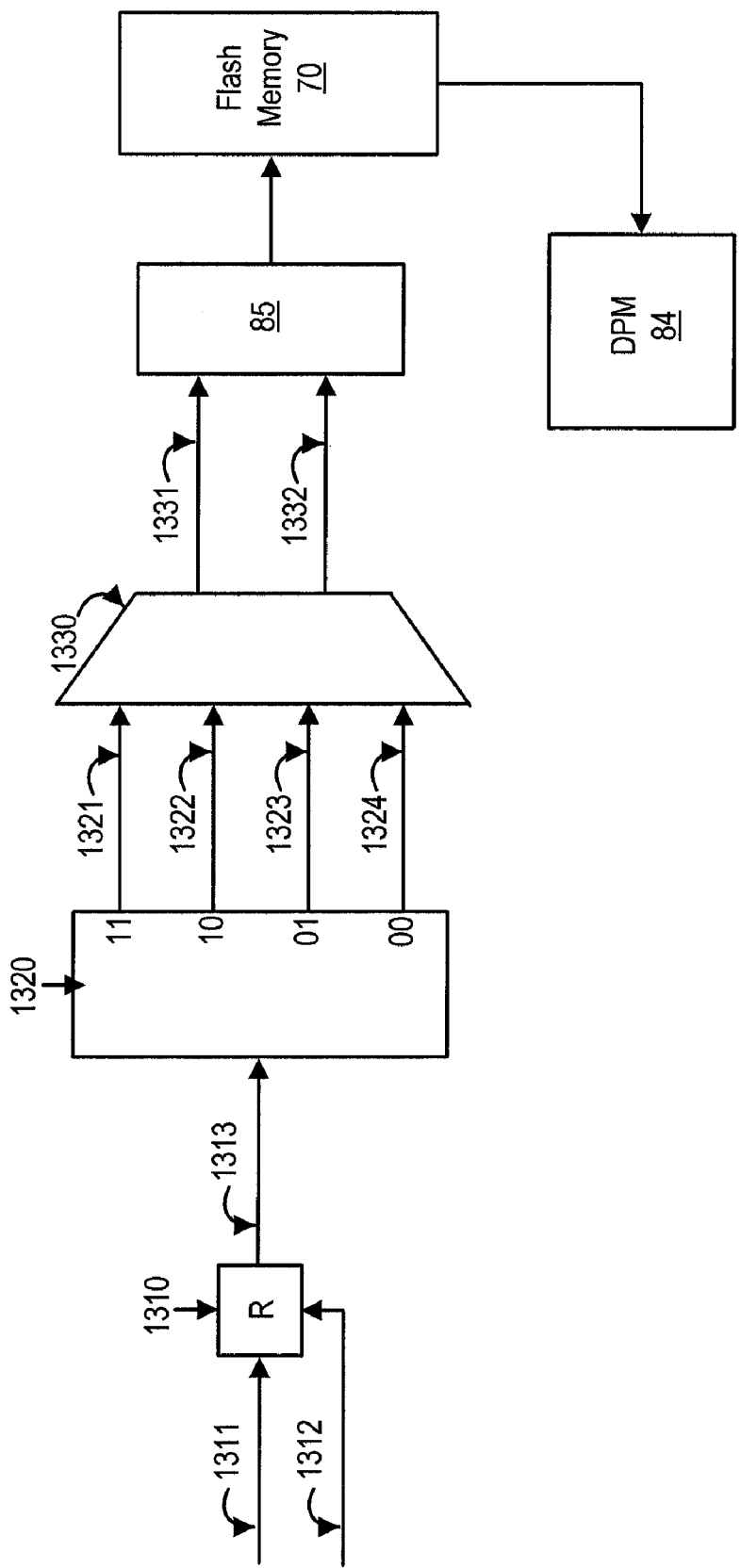
FIG. 13 shows a block diagram of the test mode states of the ATE machine as processed in an FPGA circuit according to some embodiments of the present invention.

FIG. 13 shows the data flow for the test mode according to some embodiments of state machine 83 within FPGA circuit 80 (cf. FIG. 5). Register 1310 receives test start signal 1311 and reset signal 1312 to send a scan-test-start signal 1313 to element 1320. In some embodiments of the present disclosure, test start signal includes a two-bit word, therefore enabling the possibility of four different routes for scan tests to take place, according to the combination 11, 10, 01, or 00, each one relating to a different route, respectively: static_idle state 1321, fast scan route 1322, scan test 1323, and scan loop 1324. Based on the selection of test mode signals 1321-1324, logic block 1330 will load test vector start address 1331 and vectors size counter value 1332 from test vector address registers in block 1330. The data 1331 and 1332 will load into flash 85 (cf. FIG. 5). Depending on the selection of 1321-1324, different scan vectors will be loaded from flash memory 70 into DPM 84 (cf. FIG. 5) to provide data of scan test.

Figure 14:
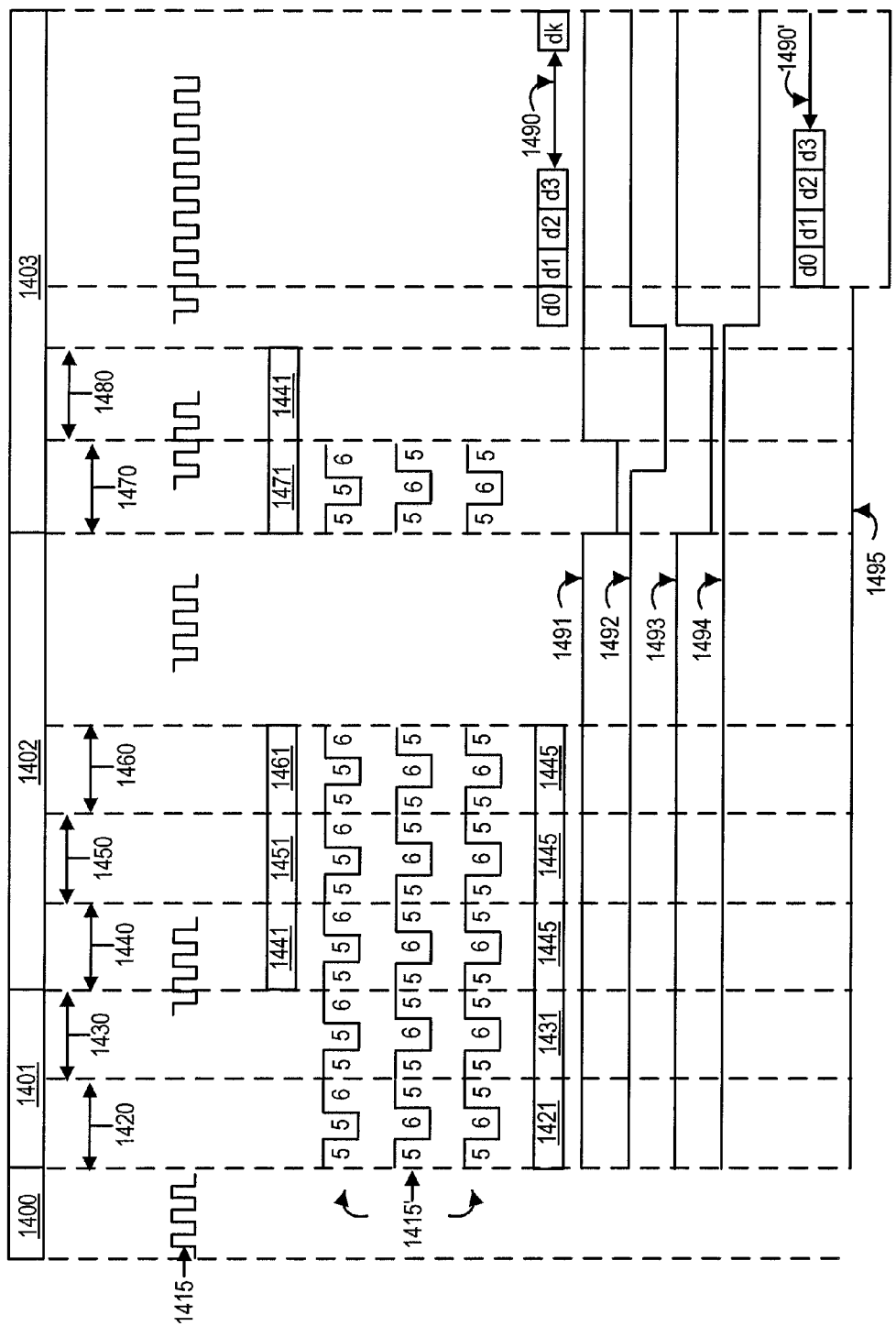
FIG. 14 shows a schematic diagram of clock signals and data flow within the flash memory as processed by an FPGA circuit according to some embodiments of the present invention.

FIG. 14 shows a schematic of the flash burst read flow, to read data from flash memory 70, according to some embodiments of flash circuit 85 (cf. FIG. 5). An exemplary embodiment of flash memory 70 may be provided by NUMONYX. According to this embodiment, eight 1-Gbit devices (Start-Flash Cellar Memory—M18—) have been implemented in daughter card 50. M18 has eight 128 Mbit partitions with 133 Mhz, zero wait-state burst read. Programming commands: WAIT, Block, Burst, Write/Read, Buffered Programming Read, Block Erased, and Single Word Write/Read, have been implemented in FPGA 80 coding, using GUI program 700 (cf. FIG. 7).

The embodiment depicted in FIG. 14 corresponds to a burst read flow, consisting in four different steps, namely: reset step 1400, Flash read initialization step 1401, issue of partition read commands step 1402, and reading data from given addresses 1403. At every step, system clock 1415 is controlling the data flow in combination with latches 1491, 1492, 1493, 1494, and 1495. For example, signals 1415', controlling the issuance of commands to Flash memory 70, are scheduled as a sequence of a high level control signal for 5 clock cycles, a low level control signal for 5 clock cycles, and a high level control signal for 6 clock cycles, as depicted in FIG. 14. Other data schemes may require a high level control signal for 5 clock cycles, a low level control signal for 6 cycles, and a high level control signal for 5 cycles, as depicted in FIG. 14.

Reset step 1400 includes the reset of counters and download of preset values for the registers from flash memory 70. Flash read initialization step 1401 includes the issuance of a command to program the read configuration register (RCR) 1421, in step 1420, and a command to confirm the programming of the RCR 1431, at step 1430. Issue of partition read commands step 1402 includes the issuance of partition read commands 1445 to every partition of flash memory 70. For example, in some embodiments of flash memory 70 depicted in FIG. 14, there are 32 partitions included, and referred as partition 0 (1440), with address 1441, partition 1 (1450), with address 1451, partition 2 (1460) with address 1461, and so on, until partition 31 (1470), with address 1471.

The reading data from the given partition address step 1403 includes the start of reading data from partition 0, address 1441, in step 1480. Data stream from partition 0 (1490), including bits d0, d1, d2, d3 ... dk, where k is the length of the bit string, starts being read asynchronously. In order to correct the de-phasing of the data relative to system clock 1415, latches 1491, 1492, 1493, and 1494 are combined in a sequence of logical operations to produce latch signal 1495, which shifts bit string 1490 into a properly synchronized bit string 1490'.

The embodiments described here are example embodiments of the invention and are not intended to be limiting. One skilled in the art may find alternatives to the examples described here, which are intended to be within the scope of this disclosure. Therefore, the invention is limited only by the following claims.

What is claimed is:

1. A first card for attachment to test load boards containing one or more devices under test (DUTs), the first card being attachable to custom-built test load boards to relieve automated test equipment (ATE) from scanning of scan-test vectors into and out of the DUTs, the first card comprising:
    a first connector for connection to outside circuitry other than the ATE, the outside circuitry being for providing scan-test input vectors to the first card;
    a second connector for connection to the test load boards;
    a memory for storing the scan-test input vectors received through the first connector;
    circuitry for:
        (a) transferring the scan-test input vectors from the first connector to the memory;
        (b) transferring the scan-test input vectors from the memory to the second connector in scanning the scan-test input vectors into the one or more DUTs through one or more of a predefined maximum number of scan chains;
        (c) receiving scan-test output vectors from the second connector in scanning the scan-test output vectors out of the one or more DUTs through one or more of the scan chains;
        (d) providing test results derived from the scan-test output vectors to the ATE through the second connector;
    wherein the circuitry comprises a scan-clock circuit for providing a scan clock for the scanning in (b) and (c);
    wherein the first card is for NOT providing a clock signal to the one or more DUTs during ATE-controlled at-speed operation of the DUTs, the clock signal to be provided by the ATE;
    wherein at least one of conditions (A) and (B) is true:
        (A) the memory capacity is unrelated to ATE capacity to store scan test input vectors;
        (B) the predefined maximum number of scan chains is unrelated to a maximum number of scan chains supported by the ATE.

2. An apparatus for enhancing an automated test equipment (ATE), comprising:
    the first card of claim 1 which is a daughter card; and
    a test load board that is connected to the first connector and that mounts a plurality of devices to be tested (DUTs).

3. The apparatus of claim 2, wherein the daughter card comprises:
    an FPGA circuit structure connected to the memory;
    a switch coupled to the FPGA structure, the switch receiving data from the plurality of DUTs.

4. The apparatus of claim 3, wherein the FPGA structure further comprises:
    a clock generator circuit which is said scan-clock circuit;
    a scan test unit communicating with the DUTs, further providing the scan clock to the DUTs from the clock generator circuit; and
    a circuit to provide a test result and test condition for each DUT to the ATE.

5. An apparatus as in claim 4 above, wherein the test load board further comprises relay circuits to provide test modes to the daughter card.

6. An apparatus as in claim 5 above, wherein the test modes comprise a 'scan enable' mode, a 'data input' mode, a 'data output' mode, and a 'test done' mode.

7. An apparatus as in claim 5 above, wherein the relay circuits provide a binary signal to a number of test start pins in the daughter card to activate different test modes.

8. An apparatus as in claim 4 above, wherein the clock generator in the FPGA structure further comprises counter circuits to provide a precise timing of the scan tests of the DUTs.

9. An apparatus as in claim 4 above, wherein the clock generator provides a 156.25 MHz clock.

10. An apparatus as in claim 3 above, wherein the memory is provided with a synchronous dynamic random access memory (SDRAM).

11. An apparatus as in claim 3 above, wherein the memory is provided with a flash memory.

12. The first card of claim 1 wherein (A) is true.

13. The first card of claim 1 wherein (B) is true.

14. The first card of claim 1 wherein both (A) and (B) are true.

15. The first card of claim 14 wherein the scan clock's frequency is unrelated to a frequency of an ATE-generated scan clock.

16. A method for testing one or more devices under test (DUTs) mounted on a test load board connected to a first card having a first connector, the test load board being connected to the first card by a second connector, the test load board being also connected to an automated test equipment (ATE), the method comprising:
    providing a scan clock by the first card;
    transferring scan-test input vectors from a memory on the first card to the one or more DUTs via the second connector and scanning the scan-test input vectors, synchronously with the scan clock, into the one or more DUTs through one or more of a predefined maximum number of scan chains, wherein the scan-test input vectors have been transferred into the memory from outside circuitry other than the ATE via the first connector;
    performing at-speed testing operation on the one or more DUTs synchronously with a clock signal provided by the ATE and not provided to the first card;
    scanning the scan-test output vectors, synchronously with the scan clock, out of the one or more DUTs to the first card via the second connector through one or more of the scan chains;
    providing test results derived from the scan-test output vectors by the first card to the ATE through the second connector;
    wherein at least one of conditions (A) and (B) is true:
        (A) the memory capacity is greater than the ATE capacity to store scan test input vectors;
        (B) the predefined maximum number of scan chains is greater than a maximum number of scan chains supported by the ATE.

17. The method of claim 16 wherein the scan clock's frequency is greater than a frequency of an ATE-generated scan clock.

18. The method of claim 17 wherein (A) is true.

19. The method of claim 17 wherein (B) is true.

20. The method of claim 17 wherein both (A) and (B) are true.

21. The method of claim 16 wherein the scan-test input vectors are scanned into the one or more DUTs through a greater number of scan chains than the maximum number of scan chains supported by the ATE.

22. The method of claim 16 wherein the scan-test output vectors are scanned out of the one or more DUTs through a greater number of scan chains than the maximum number of scan chains supported by the ATE.

23. The method of claim 16 further comprising transferring the scan-test input vectors from the outside circuitry via the first connector to the memory.

* * * * *